United States Patent [19]
Landis

[11] Patent Number: 5,034,349
[45] Date of Patent: Jul. 23, 1991

[54] METHOD OF MAKING A CONNECTOR ASSEMBLY FOR A SEMICONDUCTOR DEVICE

[75] Inventor: Richard C. Landis, Shelton, Conn.

[73] Assignee: ITT Corporation, New York, N.Y.

[21] Appl. No.: 385,630

[22] Filed: Jul. 26, 1989

Related U.S. Application Data

[60] Division of Ser. No. 198,719, May 24, 1988, Pat. No. 4,866,504, which is a continuation of Ser. No. 859,940, May 5, 1986, abandoned.

[51] Int. Cl.⁵ .................................................. H01L 21/60
[52] U.S. Cl. ................................... 437/206; 437/209; 437/220; 29/837
[58] Field of Search ................... 29/837; 437/180, 182, 437/206, 209, 220

[56] References Cited

U.S. PATENT DOCUMENTS

| | | | |
|---|---|---|---|
| 3,832,769 | 9/1974 | Olyphant, Jr. | 437/209 |
| 4,387,388 | 6/1983 | Zakhariya | 357/68 |
| 4,472,876 | 9/1984 | Nelson | 361/414 |
| 4,866,504 | 9/1989 | Landis | 357/65 |
| 4,933,810 | 6/1990 | Cardashian et al. | 361/398 |

Primary Examiner—Olik Chaudhuri
Assistant Examiner—Andrew Griffs
Attorney, Agent, or Firm—Arthur L. Plevy

[57] ABSTRACT

A direct device-to-connector interconnection includes a plurality of conductive strips affixed to a support member, each strip being cooperatively sized and aligned to establish a direct fanned out connection between a bonding pad and an external connector.

3 Claims, 2 Drawing Sheets

METHOD OF MAKING A CONNECTOR ASSEMBLY FOR A SEMICONDUCTOR DEVICE

This application is a division of application Ser. No. 07/198,719, filed May 24, 1988, now U.S. Pat. No. 4,866,504, which is a continuation of application Ser. No. 06/859,940, filed May 05, 1986, now abandoned.

CROSS-REFERENCE TO RELATED APPLICATIONS

This application is related to one, or more, of the following U.S. patent applications: Ser. No. 859,964, filed May 5, 1986, entitled PACKAGE FOR A SEMICONDUCTOR ASSEMBLY and now abandoned; Ser. No. 860,168 filed May 5, 1986 and now U.S. Pat. No. 4,739,446, entitled HEADER FOR A WAFER SCALE ASSEMBLY; Ser. No. 859,942 filed May 5, 1986 and now abandoned, entitled MULTI-LAYER CONNECTION FOR A SEMICONDUCTOR CHIP; Ser. No. 859,982 filed May 5, 1986 and now U.S. Pat. No. 4,709,300 entitled JUMPER FOR A SEMICONDUCTOR ASSEMBLY; Ser. No. 859,961 filed May 5, 1986 and now abandoned, entitled SEMICONDUCTOR INTEGRATED DEVICE HAVING REDUNDANT TERMINALS FOR DISCRETE ELECTRICAL CONDUCTORS; Ser. No. 859, 940 filed May 5, 1986 and now abandoned, entitled MULTIPLE WAFER SCALE ASSEMBLY APPARATUS AND FIXTURE FOR USE DURING THE FABRICATION THEREOF; Ser. No. 859,963 filed May 5, 1986 and now U.S. Pat. No. 4,751,464, entitled INTERLAYER CONDUCTIVE CONNECTIONS AND METHOD FOR FORMING SAME and Ser. No. 859,938 filed May 5, 1986 and now abandoned, entitled UNIVERSAL WAFER SCALE ASSEMBLY all filed on even date herewith and assigned to the assignee hereof.

BACKGROUND OF THE INVENTION

The present invention generally relates to an interconnection for use with semiconductor devices and, in particular, relates to one such interconnection for use directly between a semiconductor device and an external connector.

Currently, most semiconductor devices, particularly those having multifunctional chips or multiple functions within a single chip are bonded into packages by the use of an intermediate member generally referred to as a header. The packages usually include pins or wires adapted to be plugged into or otherwise connected to corresponding sockets. Such an arrangement thus requires two levels of interconnection. The first level of interconnection being between the semiconductor chip and the header and the second level being between the header and the package. Such bilevel interconnections introduce considerable constraints on the manufacturing of such semiconductor devices. For example, both levels of interconnection must be tested to ensure the absence of a failure. Further, failures originating from either level increase the number of overall device failures. Still further, the pattern of either level of interconnections can constrict the freedom of design at the other levels.

A further constraint introduced by such bilevel connections is that the overall cost of such devices is continually increasing due, not only to the cost of the metals, and other materials, involved, but the increased costs of labor involved in both manufacturing the package and header and assembling the device.

Consequently, an interconnection that is adapted for direct connections between a wafer and an external connector can result in both a reduction in cost and a completed device having improved reliability.

SUMMARY OF THE INVENTION

Accordingly, it is one object of the present invention to provide an interconnection for directly connecting a semiconductor device and an external connector.

This object is accomplished, at least in part, by a device-to-pin interconnection having a plurality of electrically conductive strips, secured to a support member and having first ends having a pattern corresponding to a predetermined wafer pad pattern and second end having a pattern corresponding to a predetermined pin pattern.

Other objects and advantages will become apparent to those skilled in the art from the following detailed description read in conjunction with the appended claims and the drawing attached hereto.

DETAILED DESCRIPTION OF THE INVENTION

Figure 1:
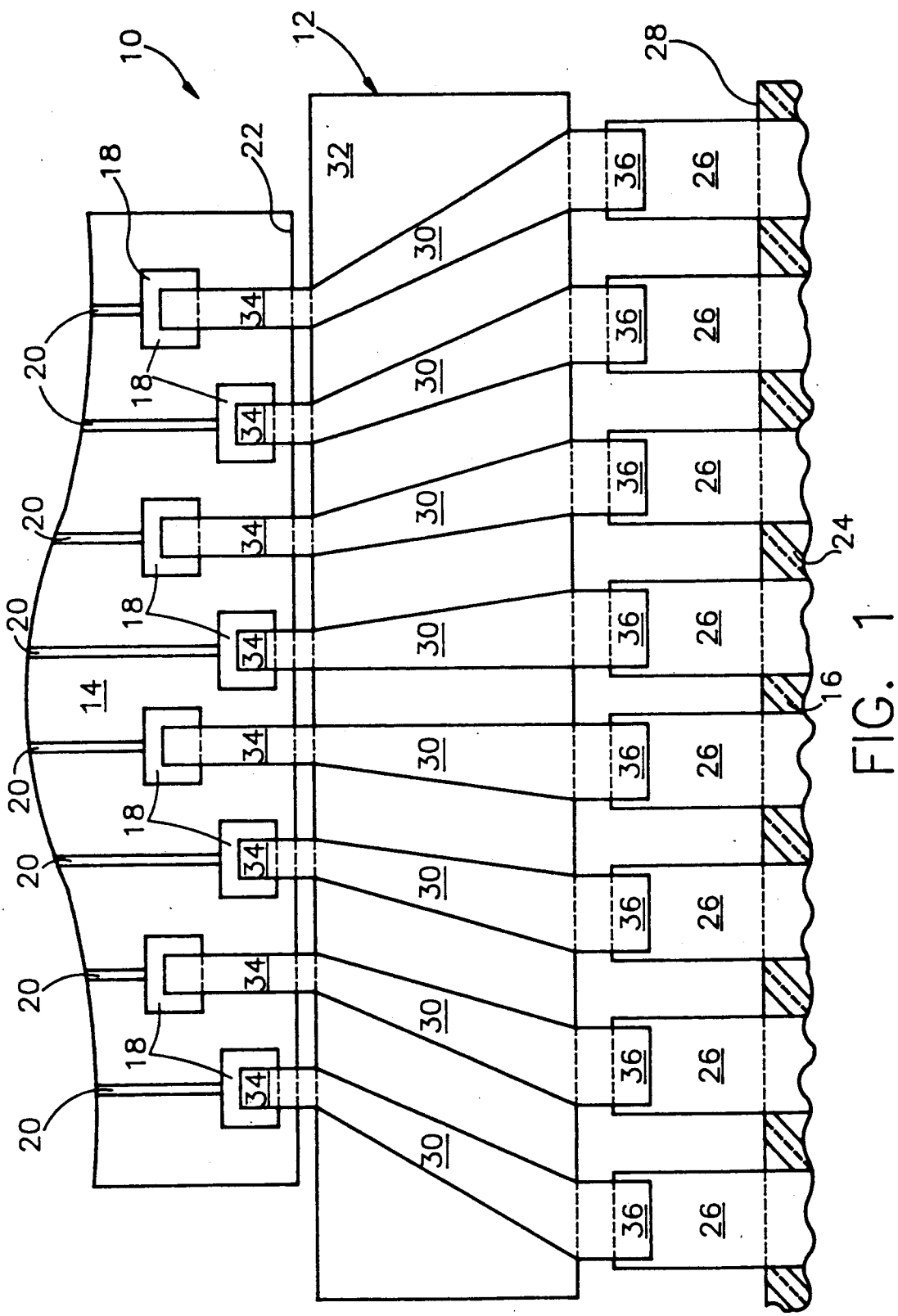
FIG. 1 is a partial plan view, not drawn to scale, of an interconnection embodying the principles of the present invention.

An exemplary apparatus, generally indicated at 10 in FIG. 1, that is particularly useful for providing an operating environment for an interconnection, generally indicated at 12 in FIG. 1 and embodying the principles of the present invention, includes a semiconductor device 14 and an external connector 16. The semiconductor device 14 is provided with a plurality of bonding pads 18 effectively terminating a plurality of conductive paths 20 associated with various elements, not shown, of the device 14. The bonding pads 18 can be formed by techniques well known in the semiconductor art. Preferably, although not necessarily, the bonding pads 18 are arranged in rows proximate an edge 22 of the device 14.

The external connector 16, in this particular embodiment, includes a header 24 having a plurality of electrically conductive pins 26 extending from a surface 28 of the header 24 proximate the edge 22 of the device 14. Although a header 24 having pins 26 associated therewith is specified in this example, the external connector 16 can, in fact, be almost any arrangement designed to provide an external interface to the device 14.

The interconnection 12 includes a plurality of electrically conductive strips 30 affixed to a support member 32. Each strip 30 is configured such that one end portion 34 thereof is sized and aligned with one of the bonding pads 18 of the semiconductor device 14 and the other end portion 36 of each strip 30 is sized and aligned with a corresponding pin 36 of the header 24.

In one particular embodiment of the device 14, the actual bonding pads 18 of the multiple rows are offset from each other thereby providing additional room for the conductor strips 30. Preferably, the bonding pads 18 are 50 micrometers by 50 micrometers and spaced on 100 micrometer centers, although other dimensions may be readily implemented. In such an embodiment, the end portions 34 alternately extend from the support member 32 different lengths. That is, the end portions 34 connecting to the row of bonding pads 18 proximate the edge 22 are relatively shorter than the end portions 34 connecting to the bonding pads 18 distal the edge 22.

In most instances, the total lateral width of the pins 26 to be connected to device 14 exceeds the lateral width of the bonding pads 18 of the device 14. Consequently, the conductive strips 30, in such an embodiment, fan-out from the first end portions 34 to the second end portions 36.

Although the complete external connector 16 is not shown in FIG. 1, the header 24 thereof, preferably, can be similar to that described and discussed in U.S. patent application Ser. No. 860,168 filed on even date herewith entitled HEADER FOR A WAFER SCALE ASSEMBLY. This application is assigned to the assignee hereof and incorporated herein by reference. In one particular application the pins 26 have a width on the order of about 250 micrometers and a thickness of about 250 micrometers. Preferably, the pins 26 are spaced on 400 micrometer centers.

The interconnection 12, in one particular embodiment, includes a plurality of copper strips affixed to an electrically insulating film, more fully discussed hereinafter, that serves as the support member 32 to maintain the spacing between adjacent conductive strips 30 and thereby prevents shorting out therebetween. In addition, the support member 32 additionally, reduces the possibility of breakage due to movement of the strips 30. The conductive strips 30 are of non-uniform width across the support member 32 to allow for any needed fan-out and to thereby reduce any sharp bends or excessive width changes proximate the end portions, 34 and 36, thereof. In this particular embodiment, the conductive strips 30 are copper having a thickness on the order of about 30 micrometers. The one end portions 34 have a substantially uniform width of about 40 micrometers and the other end portions 36 have a substantially uniform width of about 150 micrometers.

Figure 2:
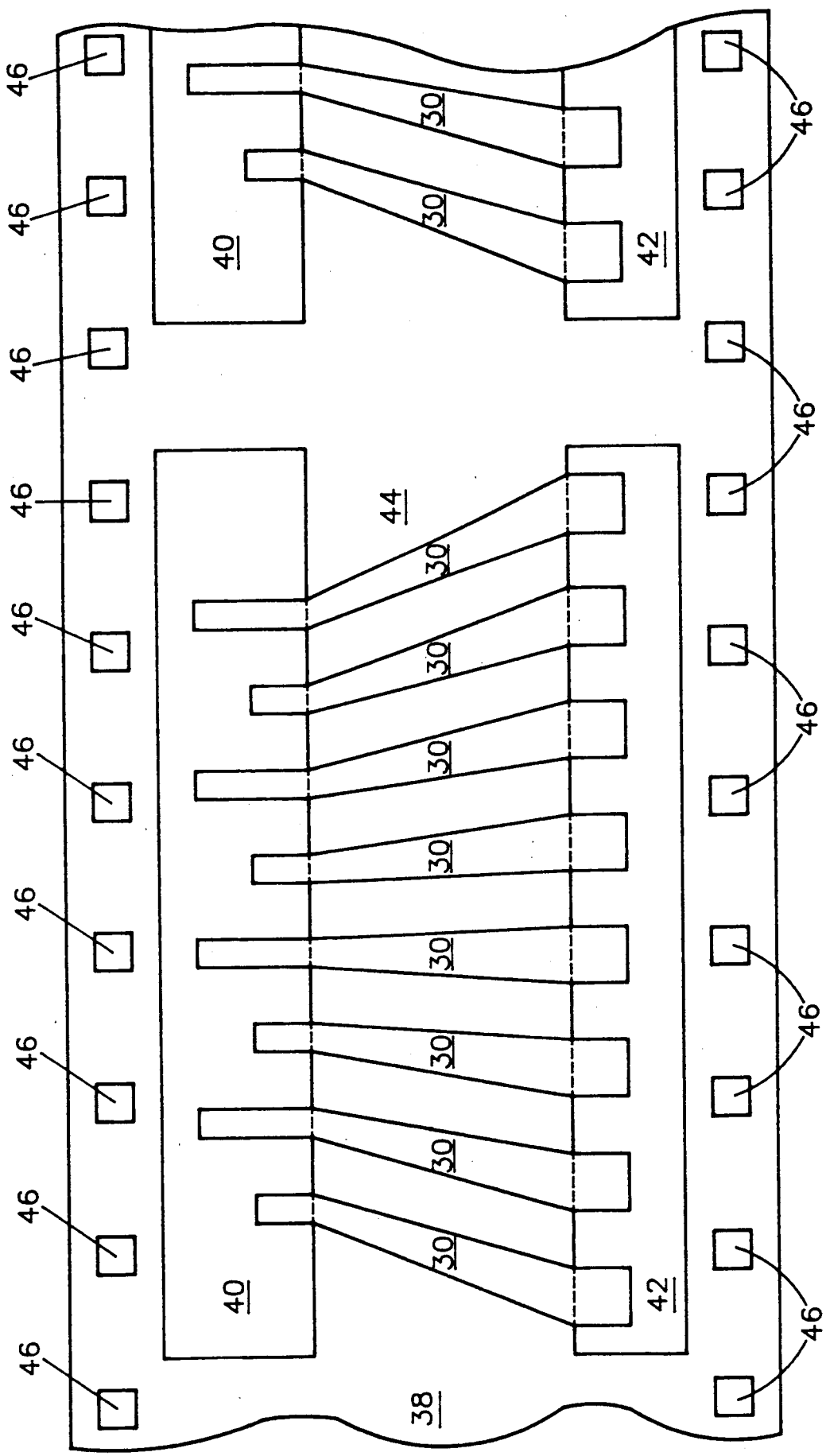
FIG. 2 is a partial plan view of the interconnection shown in FIG. 1 prior to the attachment thereof.

One embodiment of the interconnection 12 is shown in FIG. 2 during the manufacture thereof and prior to connection between the bonding pads 18 and pins 26.

As shown therein, the interconnection 12 includes a tape segment 38 having first and second windows, 40 and 42, respectively, spaced apart by a portion 44 of the tape segment 38 that effectively defines the support member 32. Preferably, the tape segment 38 includes means 46 for aligning the windows, 40 and 42, over the work piece, i.e., the bond pads 18 and pins 26. In one preferred embodiment the means 46 includes a series of prepunched holes that effectively define a sprocket pattern. The provision of such a sprocket pattern allows the interconnection 12 to be used in an automated assembly mechanism.

In one preferred embodiment, the interconnection 12 is fabricated by use of a tape segment 38 having the windows, 40 and 42, and the sprocket holes 46 prepunched therein. The conductive strips 30 are defined by first forming a layer of conductive material, for example, copper, on the order of about one ounce per square foot, on the prepunched tape segment 38 and secured thereto via known adhesive techniques. Subsequent to the application of the copper film, the pattern for the conductive strips 30 is defined by, for example, a photomask etching technique. Subsequent to etching, the plurality of conductive strips 30 remain having the end portion, 34 and 36, thereof cantilevered over the spaced apart windows, 40 and 42, respectively.

In application, a work piece, i.e., the semiconductor device 14 and the external connector 16, is inserted into respective recesses of a predesigned fixture. One typical fixture that is particularly adaptable for use with the interconnection 12 is shown and described in U.S. patent application Ser. No. 859,940 filed on even date herewith and entitled MULTIPLE WAFER SCALE ASSEMBLY APPARATUS AND FIXTURE FOR USE DURING THE FABRICATION THEREOF. This patent application is assigned to the assignee hereof and deemed incorporated herein by reference. As shown therein, the fixture includes a plurality of recesses of varying depths designed to ensure that all of the surfaces whereat the interconnection 12 is to be bonded lie in a single plane when the pieces are positioned therein. The interconnection 12 is then aligned over the bonding pads 18 and the pins 26 in an automated fashion by, for example, use of the sprocket holes. Thereafter, the individual conductive strips 30 are bonded by, for example, thermal compression bonding or other techniques known in the art.

The interconnection 12 described herein is advantageous in that it eliminates one level of connection by making a direct connection between a semiconductor device 14 and an external connector 16. Specifically, the use of a header to connect intermediate the wafer and an external connector is effectively eliminated. In addition, the ability to provide a plurality of conductive strips 30 in a relatively small physical area with an assurance that adjacent strips 30 will not short out or an overlapping of wires will not occur is particularly advantageous in the semiconductor art.

Although the present invention has been described with respect to a particular embodiment, it will be understood that other arrangements and configurations may be developed that nevertheless, do not depart from the spirit and scope of the present invention. Hence, the present invention is deemed limited only by the appended claims and the reasonable interpretation thereof.

What is claimed is:

1. A method of forming a single level interconnection, said method comprising the steps of:
   forming first and second windows in an electrically isolating film; and thereafter
   forming a plurality of electrically conductive strips on said film, said strips being formed with first end portions thereof cantilevered over said first windows and second end portions thereof cantilevered over said second windows.

2. Method as claimed in claim 1 further comprising the step of:
   forming, along the edges of said film, a sprocket pattern, said sprocket pattern including rows of regularly spaced openings.

3. Method as claimed in claim 1 wherein said strip forming step includes:
   disposing a layer of conductive material on said film having said first and second windows therein; and thereafter
   defining said plurality of conductive strips.

* * * * *